(12) United States Patent
Yu et al.

(10) Patent No.: US 12,292,456 B2
(45) Date of Patent: May 6, 2025

(54) WEDGE AMPLITUDE-MODULATION PROBE CARD AND A MAIN BODY THEREOF

(71) Applicant: MAXONE SEMICONDUCTOR CO., LTD., Jiangsu (CN)

(72) Inventors: Haichao Yu, Suzhou (CN); Ming Zhou, Suzhou (CN)

(73) Assignee: MAXONE SEMICONDUCTOR CO., LTD., Suzhou (CN)

( * ) Notice: Subject to any disclaimer, the term of this patent is extended or adjusted under 35 U.S.C. 154(b) by 225 days.

(21) Appl. No.: 18/254,985

(22) PCT Filed: Jul. 27, 2021

(86) PCT No.: PCT/CN2021/108741
§ 371 (c)(1),
(2) Date: May 30, 2023

(87) PCT Pub. No.: WO2022/110857
PCT Pub. Date: Jun. 2, 2022

(65) Prior Publication Data
US 2024/0053384 A1    Feb. 15, 2024

(30) Foreign Application Priority Data

Nov. 30, 2020  (CN) .......................... 202011366981.3

(51) Int. Cl.
*G01R 1/073* (2006.01)
*G01R 31/26* (2020.01)
*G01R 31/28* (2006.01)

(52) U.S. Cl.
CPC ..... *G01R 1/07342* (2013.01); *G01R 31/2603* (2013.01); *G01R 31/2889* (2013.01)

(58) Field of Classification Search
CPC ............ G01R 1/07342; G01R 31/2603; G01R 31/2889; G01R 1/07364
(Continued)

(56) References Cited

U.S. PATENT DOCUMENTS 4,251,772 A * 2/1981 Worsham ........... G01R 1/06705
            324/750.25
4,520,314 A * 5/1985 Asch .................. G01R 1/07307
            324/755.07
(Continued)

FOREIGN PATENT DOCUMENTS

CN       102753979 A    10/2012
CN       112462110 A     3/2021
(Continued)

OTHER PUBLICATIONS

Oct. 18, 2021 International Search Report issued in International Patent Application No. PCT/CN2021/108741.

*Primary Examiner* — Christopher P McAndrew
(74) *Attorney, Agent, or Firm* — Oliff PLC

(57) ABSTRACT

A wedge amplitude-modulation probe card and a main body thereof. The probe card includes a probe card main body, upper wedge plates and lower wedge plates. Several upper wedge plates and several lower wedge plates are slidably arranged inside the probe card main body, and the several upper wedge plates and the several lower wedge plates are sequentially arranged at intervals in a staggered manner, so that by means of inserting different numbers of upper wedge plates between the lower wedge plates, probes on the upper wedge plates can be inserted into or shifted out of a probe queue thereunder, so as to increase or decrease the number of probes for testing, and thus, the testing amplitude of a single probe card can be adjusted, such that the probe card has universality.

11 Claims, 7 Drawing Sheets

(58) Field of Classification Search
USPC .................................................. 324/756.04
See application file for complete search history.

(56) References Cited

U.S. PATENT DOCUMENTS

| | | | | |
|---|---|---|---|---|
| 6,280,116 | B1* | 8/2001 | Szu | H01L 23/4093 |
| | | | | 361/709 |
| 7,323,890 | B2* | 1/2008 | Petersen | G01R 27/14 |
| | | | | 324/754.11 |
| 8,643,394 | B2* | 2/2014 | Kuo | G01R 31/2889 |
| | | | | 324/754.03 |
| 9,103,876 | B2 | 8/2015 | Nguyen et al. | |
| 9,513,168 | B2* | 12/2016 | Johnson | G02B 7/00 |
| 2005/0011080 | A1* | 1/2005 | Gunderson | G01B 21/24 |
| | | | | 33/645 |
| 2006/0022686 | A1* | 2/2006 | Fan | G01R 1/07342 |
| | | | | 324/750.25 |
| 2012/0319713 | A1 | 12/2012 | Nguyen et al. | |
| 2020/0182928 | A1* | 6/2020 | Shakya | G01R 31/2889 |

FOREIGN PATENT DOCUMENTS

| | | |
|---|---|---|
| CN | 112462111 A | 3/2021 |
| CN | 112462112 A | 3/2021 |
| CN | 112526179 A | 3/2021 |
| JP | 2005-127842 A | 5/2005 |

* cited by examiner

WEDGE AMPLITUDE-MODULATION PROBE CARD AND A MAIN BODY THEREOF

TECHNICAL FIELD

The present invention belongs to the technical field of probe cards, and particularly relates to a wedge amplitude-modulation probe card and a main body thereof.

BACKGROUND OF INVENTION

With the development of the semiconductor industry, more and more electronic devices are connected to semiconductor wafers. During the manufacturing process of semiconductor devices, the probe is contacted with the metal end of the semiconductor wafer to achieve temporary electrical connection, so that the electrical signal of the tester is transmitted to the semiconductor device through the probe and the tester detects the electronic device on the semiconductor wafer through the returned electrical signal.

The probe card is the link between the semiconductor wafer and the tester. Multiple probes are integrated on the probe card so that multiple probes can simultaneously contact multiple semiconductor devices on the semiconductor wafer to improve the detection efficiency.

During the production process of semiconductor devices, it is necessary to access a large number of circuit contacts in one or more devices multiple times, and move the probe card through a moving mechanism to make the probes contact with the contact. At the same time, in order to match multiple sets of contacts during the detection process, the probe card needs to be equipped with multiple probes, which are fixed by a holder that is a polyhedron that can rotate. By setting one or more probe cards on each surface, and when the probe cards need to be switched, the corresponding probe cards are rotated to the top of the semiconductor device for testing by rotating the retainer or by setting multiple movable platforms to move the probe cards, so that matching the probe cards with different contact sets can be achieved. In the prior art, in order to achieve the testing of multiple sets of contacts, the exchange of probe cards is adopted to achieve the matching, and different probe cards are switched to achieve the matching. However, as a single probe card cannot be universal, the driving structure of the probe card becomes complicated.

Disclosure of the Invention

The present invention overcomes the shortcomings of the prior art mentioned above and provides a wedge amplitude-modulation probe card and its main body, which can adjust the testing amplitude of the probe car, so that a single probe card can test different sets of contacts with different amplitude and has universality.

The technical solution of the present invention:
A wedge amplitude-modulation probe card comprises a probe card main body, upper wedge plates and lower wedge plates. Several upper wedge plates and several lower wedge plates are slidably arranged inside the probe card main body, and the several upper wedge plates and the several lower wedge plates are sequentially arranged at intervals in a staggered manner;
The probe card main body comprises a main body frame, a probe slot, and an upper wedge plate slot. The main body frame internally accommodates several upper wedge plates and lower wedge plates along the length direction, and the bottom of the main body frame is provided with a probe slot for the probes to pass through along the length direction. The main body frame is also provided with an upper wedge plate slot for the upper wedge plates to be exposed partially;
The upper wedge plate comprises an upper wedge plate body, an upper wedge plate wedge, upper wedge plate probes, and upper wedge plate contacts. The lower end of the upper wedge plate body is provided with an upper wedge plate wedge, and both sides of the upper wedge plate wedge extend to the two sides of the upper wedge plate body. The lower end of the upper wedge plate wedge is provided with upper wedge plate probes, and one end of the upper wedge plate contacts is connected to the upper wedge plate probes, and the other end of the upper wedge plate contacts is exposed from one side of the upper wedge plate body;
The lower wedge plate comprises a lower wedge plate body, a lower wedge plate wedge, lower wedge plate probes, and lower wedge plate contacts. The upper end of the lower wedge plate body is provided with a lower wedge plate wedge, and both sides of the lower wedge plate wedge extend to the two sides of the lower wedge plate body. The lower end of the lower wedge plate wedge is provided with lower wedge plate probes, and one end of the lower wedge plate contacts is connected to the lower wedge plate probes, and the other end of the lower wedge plate contacts is exposed from one side of the lower wedge plate body;
The probe spacing required for the contacts to be tested is defined as the standard probe spacing. The thickness of the upper wedge plate body and the lower wedge plate body are standard probe spacing, the probe card main body is provided with several fixed contacts at intervals at one side corresponding to the upper wedge plate contacts and lower wedge plate contacts, and one end of the several fixed contacts is connected with the testing circuit board, and the other end of the fixed contacts extends to the interior of the main body frame, and the spacing between the adjacent fixed contacts is the standard probe spacing.

Furthermore, the probe card main body also comprises a fixed block for the main body, a movable block for the main body, and a spring for the movable block for the main body. One side of the main body frame is provided with a fixed block for the main body, and the side of the fixed block for the main body contacts one side of the several upper wedge plates and lower wedge plates sequentially arranged at intervals in a staggered manner; and the other side of the main body frame is slidably provided with a movable block for the main body, and the side of the movable block for the main body contacts the other side of the several upper wedge plates and lower wedge plates sequentially arranged at intervals in a staggered manner; and the movable block for the main body is connected to the probe card main body through the spring for the movable block for the main body.

Furthermore, the upper wedge plate also comprises an extension plate of the upper wedge plate, and the extension plate of the upper wedge plate is formed by extending the upper end of the upper wedge plate body upwards, and the extension plate of the upper wedge plate passes through the upper wedge plate slot and extends to the outside of the probe card main body.

Furthermore, the upper wedge plate also comprises an upper wedge plate slider, and the upper wedge plate body is provided with an upper wedge plate slider on both sides respectively, and the upper wedge plate sliders are slidably connected to the inner wall of the probe card main body.

Furthermore, the lower wedge plate also comprises a lower wedge plate slider, and the lower wedge plate body is provided with a lower wedge plate slider on both sides respectively, and the lower wedge plate sliders are slidably connected to the inner wall of the probe card main body.

Furthermore, an amplitude-modulation structure is arranged above the probe card main body, and the amplitude-modulation structure comprises a pressing block. The pressing block is arranged above the exposed part of the upper wedge plate on the probe card main body, and the pressing block can press down on the exposed part of a single or multiple upper wedge plates, causing the upper wedge plate to move downward.

A wedge amplitude-modulation probe card main body, and several upper wedge plates and several lower wedge plates are slidably arranged inside the probe card main body, and the several upper wedge plates and the several lower wedge plates are sequentially arranged at intervals in a staggered manner; the probe card main body comprises a main body frame, a probe slot, and an upper wedge plate slot. The main body frame internally accommodates several upper wedge plates and lower wedge plates along the length direction, and the bottom of the main body frame is provided with a probe slot for the probes to pass through along the length direction. The main body frame is also provided with an upper wedge plate slot for the upper wedge plates to be exposed partially; one side of the main body frame is provided with several fixed contacts at intervals at one side, and one end of the several fixed contacts is connected with the testing circuit board, and the other end of the fixed contacts extends to the interior of the main body frame; the probe card main body also comprises a fixed block for the main body, a movable block for the main body, and a spring for the movable block for the main body. One side of the main body frame is provided with a fixed block for the main body, and the side of the fixed block for the main body contacts one side of the several upper wedge plates and lower wedge plates sequentially arranged at intervals in a staggered manner; and the other side of the main body frame is slidably provided with a movable block for the main body, and the side of the movable block for the main body contacts the other side of the several upper wedge plates and lower wedge plates sequentially arranged at intervals in a staggered manner; and the movable block for the main body is connected to the probe card main body through the spring for the movable block for the main body.

A probe card wedge amplitude-modulation method includes the following steps:

Step a: Determine the amplitude modulation distance: Before amplitude modulation, several upper wedge plates contact laterally and several lower wedge plates contact laterally. The upper wedge plate wedge at the lower end of the upper wedge plate is embedded between the lower wedge plate wedges of two adjacent lower wedge plates below it, and the upper wedge plate probes of each upper wedge plate are located above the testing area, and the lower wedge plate probes of each lower wedge plate are located in the testing area, and the upper wedge plate contacts of each upper wedge plate are located above several fixed contacts, and the lower wedge plate contacts of each lower wedge plate contact several fixed contacts in a direction from left to right. The probe spacing in the testing area is defined as (m), which is the unit distance corresponding to the distance between the contacts to be tested. The width of the lower wedge plate probe of each lower wedge plate located in the testing area is the basic amplitude (n), and the width of the contacts to be tested in the testing area is the amplitude to be tested (o). The difference value between the amplitude to be tested (o) and the basic amplitude (n) is obtained as the amplitude modulation distance that is an integer multiple of the probe spacing (m);

Step b: Move the wedge: The amplitude modulation distance obtained by the amplitude modulation distance determined through step a is a multiple of the probe spacing (m). As the number of moving upper wedge plates, the upper wedge plates corresponding to the multiple are moved downward in the direction from right to left. The upper wedge plate wedges at the lower end of the upper wedge plate are inserted between the two adjacent lower wedge plates below it until the upper wedge plate probes at the lower end of the upper wedge plate enter the testing area, and at the same time, the lower wedge plate on the right side of the moved upper wedge plate is pushed to move to the right;

Step c: Contacts connection: When the upper wedge plate is moved, the upper wedge plate contacts of the moved upper wedge plate move downwards to the horizontal height of several fixed contacts from the upper direction, and contact with one of the fixed contacts. The lower wedge plate contacts of the pushed lower wedge plate are separated from the fixed contacts of the original contacts, and contact with one of the fixed contacts on the right;

Step d: Refresh probe testing connection: The testing circuit board is electrically reconnected to the lower wedge plate probes on the fixed lower wedge plate, the lower wedge plate probes on the pushed lower wedge plate, and the upper wedge plate probes at the lower end of the moved upper wedge plate through several fixed contacts.

Furthermore, in step a, the thicknesses of the upper wedge plate and lower wedge plate are both set to be the probe spacing (m) during the determination of the amplitude modulation distance.

Furthermore, in step b, when the wedge is moved, the moved upper wedge plate moves downwards to an area where its side overlaps with the lower wedge plate.

Furthermore, a wedge amplitude modulation probe card is used for amplitude modulation.

Furthermore, the wedge amplitude-modulation probe card comprises a probe card main body, upper wedge plates and lower wedge plates. Several upper wedge plates and several lower wedge plates are slidably arranged inside the probe card main body, and the several upper wedge plates and the several lower wedge plates are sequentially arranged at intervals in a staggered manner.

The amplitude-modulation structure of a wedge amplitude-modulation probe card is arranged above the probe card main body, and it comprises a pressing block. The pressing block is arranged above the exposed part of the upper wedge plate on the probe card main body, and the pressing block can press down on the exposed part of a single or multiple upper wedge plates, causing the upper wedge plate to move downward;

The amplitude-modulation structure further comprises: a pressing block plate, a pressing block plate pin, a pressing block plate pin groove, a pressing block crossbar, a crossbar slider, a crossbar spring, a crossbar slider screw rod, a first helical gear, a second helical gear, a transmission rod, a sliding gear, a sliding plate, a housing, a tooth roller, and a sliding plate screw rod. Several pressing block plates are parallelly and slidably arranged on the pressing block crossbar to form a pressing block, and the lower end of each pressing block plate is equipped with a pressing block plate pin, and each upper wedge plate is equipped with a pressing block plate pin groove at the upper end, and the pressing block crossbar on the left side of the pressing block is slidably provided with a crossbar slider, and the pressing block crossbar on the right side of the pressing block is sleeved with a crossbar spring, and the cross-section of the pressing block crossbar is rectangular, and the upper end of the crossbar slider is sleeved on the crossbar slider screw rod, and the crossbar slider screw rod is fixedly equipped with the first helical gear, and the first helical gear meshes with the second helical gear, and the second helical gear is fixedly connected to the lower end of the transmission rod, and the upper end of the transmission rod is fixedly connected to a sliding gear, and the middle of the transmission rod is rotationally connected to the sliding plate, and the sliding plate is slidably arranged inside the housing, and the housing is fixedly connected to the probe card main body. The two ends of the crossbar slider screw rod are respectively rotationally connected to the sliding plate, and the two ends of the pressing block crossbar are fixedly connected to the sliding plate, and the sliding gear meshes with the tooth roller, and both ends of the tooth roller are rotationally connected to the housing, and the middle of the sliding plate is sleeved on the sliding plate screw rod, and both ends of the sliding plate screw rod are rotationally connected to the housing.

Furthermore, it also comprises a reset frame and a reset frame spring. The reset frame is sleeved on the outer side of the probe card main body, and a reset frame spring is arranged between the lower end of the reset frame and the inner wall of the housing. The upper wedge plate slider of the upper wedge plate overlaps the upper end of the reset frame.

Furthermore, it also comprises a reset frame push rod, and the upper end of the reset frame push rod is fixedly connected to the sliding plate, and the lower end of the reset frame push rod is suspended above the reset frame.

Furthermore, it is applied to a wedge amplitude-modulation probe card.

Furthermore, the wedge amplitude-modulation probe card comprises a probe card main body, upper wedge plates and lower wedge plates. Several upper wedge plates and several lower wedge plates are slidably arranged inside the probe card main body, and the several upper wedge plates and the several lower wedge plates are sequentially arranged at intervals in a staggered manner;

The probe card main body comprises a main body frame, a probe slot, and an upper wedge plate slot. The main body frame internally accommodates several upper wedge plates and lower wedge plates along the length direction, and the bottom of the main body frame is provided with a probe slot for the probes to pass through along the length direction. The main body frame is also provided with an upper wedge plate slot for the upper wedge plates to be exposed partially.

The docking structure of the amplitude-modulation structure of a wedge amplitude-modulation probe card comprises a pressing block plate, a pressing block plate pin, a pressing block plate pin groove, a pressing block crossbar, a crossbar slider, a crossbar spring, a crossbar slider screw rod, a first helical gear, a second helical gear, a transmission rod, a sliding gear, a sliding plate, a housing, a tooth roller, and a sliding plate screw rod. Several pressure block plates are parallelly and slidably arranged on the pressing block crossbar to form a pressing block, and the lower end of each pressing block plate is equipped with a pressing block plate pin, and each upper wedge plate is equipped with a pressing block plate pin groove at the upper end, and the pressing block crossbar on the left side of the pressing block is slidably provided with a crossbar slider, and the pressing block crossbar on the right side of the pressing block is sleeved with a crossbar spring, and the cross-section of the pressing block crossbar is rectangular.

The amplitude-modulation piece of a wedge amplitude-modulation probe card is arranged above the probe card main body, and it comprises a pressing block. The pressing block is arranged above the exposed part of the upper wedge plate on the probe card main body, and the pressing block can press down on the exposed part of a single or multiple upper wedge plates, causing the upper wedge plate to move downward;

The amplitude-modulation piece also comprises a pressing block disk, a pressing block disk ring, a pressing block disk ring groove, a pressing block disk rod, a pressing block disk stopper, a slide rest, a shell, a driving gear, a tooth roll shaft, a slide rest screw rod, a fixed rod and a fixed rod through hole. Several pressing block disks are parallelly and slidably arranged on the pressing block disk rod to form a pressing block, and several pressing block disks are eccentrically arranged on the pressing block disk rod. The outer part of each pressing block disk is fixed with a pressing block disk ring, and the upper end of each upper wedge plate is equipped with a pressing block disk ring groove, and the pressing block disk rod on the left side of the pressing block is sleeved with a pressing block disk stopper, and the pressing block disk rod on the right side of the pressing block is sleeved with a disk rod spring, and the side of the pressing block disk rod is provided with a guide bar along the axial direction, the left end of the pressing block disk stopper is fixedly connected to the slide rest, the slide rest is slidably arranged inside the shell, and the shell is fixedly arranged on the probe card main body, and the right end of the pressing block disk rod is rotationally connected to the slide rest, and the left end of the pressing block disk rod passes through the pressing block disk stopper and the side wall of the slide rest sequentially to be fixedly connected to the driving gear, and the driving gear engages with the tooth roll shaft, and both ends of the tooth roll shaft are rotationally connected to the shell, and the upper end of the slide rest is sleeved on the slide rest screw rod, and both ends of the slide rest screw rod are rotationally connected to the shell. One end of the fixed rod is fixedly connected to the left end of the slide rest, and the other end of the fixed rod is suspended, and the exposed part of the upper wedge plate is equipped with a fixed rod through hole corresponding to the fixed rod.

Furthermore, it also comprises an outer frame and an outer frame spring. The outer frame is sleeved on the outer side of the probe card main body, and an outer frame spring is arranged between the lower end of the outer frame and the inner wall of the shell. The upper wedge plate slider of the upper wedge plate overlaps the upper end of the outer frame.

Furthermore, it is applied to a wedge amplitude-modulation probe card.

Furthermore, the wedge amplitude-modulation probe card comprises a probe card main body, upper wedge plates and lower wedge plates. Several upper wedge plates and several lower wedge plates are slidably arranged inside the probe card main body, and the several upper wedge plates and the several lower wedge plates are sequentially arranged at intervals in a staggered manner;

The probe card main body comprises a main body frame, a probe slot, and an upper wedge plate slot. The main body frame internally accommodates several upper wedge plates and lower wedge plates along the length direction, and the bottom of the main body frame is provided with a probe slot for the probes to pass through along the length direction. The main body frame is also provided with an upper wedge plate slot for the upper wedge plates to be exposed partially.

The docking structure of the amplitude-modulation piece of the wedge amplitude-modulation probe card comprises a pressing block disk, a pressing block disk ring, a pressing block disk ring groove, a pressing block disk rod, a pressing block disk stopper, a slide rest and a shell. Several pressing block disks are parallelly and slidably arranged on the pressing block disk rod to form a pressing block, and several pressing block disks are eccentrically arranged on the pressing block disk rod. The outer part of each pressing block disk is fixed with a pressing block disk ring, and the upper end of each upper wedge plate is equipped with a pressing block disk ring groove, and the pressing block disk rod on the left side of the pressing block is sleeved with a pressing block disk stopper, and the pressing block disk rod on the right side of the pressing block is sleeved with a disk rod spring, and the side of the pressing block disk rod is provided with a guide bar along the axial direction, the left end of the pressing block disk stopper is fixedly connected to the slide rest, and the slide rest is slidably arranged inside the shell, and the shell is fixedly arranged on the probe card main body.

The beneficial effects of the invention are as follows:

The wedge amplitude-modulation probe card of the present invention comprises a probe card main body, upper wedge plates and lower wedge plates. Several upper wedge plates and several lower wedge plates are slidably arranged inside the probe card main body, and the several upper wedge plates and the several lower wedge plates are sequentially arranged at intervals in a staggered manner, so that by means of inserting different numbers of upper wedge plates between the lower wedge plates, probes on the upper wedge plates can be inserted into or shifted out of a probe queue thereunder, so as to increase or decrease the number of probes for testing, and thus, the testing amplitude of a single probe card can be adjusted, such that the probe card has universality.

The amplitude-modulation structure of the wedge amplitude-modulation probe card of the present invention comprises a pressing block plate, a pressing block plate pin, a pressing block plate pin groove, a pressing block crossbar, a crossbar slider and a crossbar spring. Several pressing block plates are parallelly and slidably arranged on the pressing block crossbar to form a pressing block, and the lower end of each pressing block plate is equipped with a pressing block plate pin, and each upper wedge plate is equipped with a pressing block plate pin groove at the upper end, and the pressing block crossbar on the left side of the pressing block is slidably provided with a crossbar slider, and the pressing block crossbar on the right side of the pressing block is sleeved with a crossbar spring, and the cross-section of the pressing block crossbar is rectangular. It can be achieved by horizontally moving the pressing blocks to align them with the exposed ends of single or multiple upper wedge plates, and the upper wedge plate can be inserted by moving the pressing blocks downwards, and by docking the pressing block plate with the upper wedge plate, during the downward movement of the pressing blocks, the pressing block plate slides horizontally with the upper wedge plate, and it can ensure stable sliding of the upper wedge plate by maintaining docking during the sliding process, and at the same time, multiple pressing block plates are slidably arranged on the pressing block crossbar, and multiple pressing block plates can move independently, adapting to different horizontal movement distances of multiple upper wedge plates.

3. The amplitude-modulation piece of the wedge amplitude-modulation probe card of the present invention comprises a pressing block disk, a pressing block disk ring, a pressing block disk ring groove, a pressing block disk rod, a pressing block disk stopper, a slide rest and a shell. Several pressing block disks are parallelly and slidably arranged on the pressing block disk rod to form a pressing block, and several pressing block disks are eccentrically arranged on the pressing block disk rod. The outer part of each pressing block disk is fixed with a pressing block disk ring, and the upper end of each upper wedge plate is equipped with a pressing block disk ring groove, and the pressing block disk rod on the left side of the pressing block is sleeved with a pressing block disk stopper, and the pressing block disk rod on the right side of the pressing block is sleeved with a disk rod spring, and the side of the pressing block disk rod is provided with a guide bar along the axial direction, the left end of the pressing block disk stopper is fixedly connected to the slide rest, and the slide rest is slidably arranged inside the housing, and the housing is fixedly arranged on the probe card main body. It can be achieved by horizontally moving the pressing blocks to align them with the exposed ends of single or multiple upper wedge plates, and the upper wedge plate can be inserted by moving the pressing blocks downwards, and by docking the pressing block disk ring with the upper wedge plate after the rotation of the pressing block disks, during the downward movement of the pressing blocks, the pressing block plate slides horizontally with the upper wedge plate, and it can ensure stable sliding of the upper wedge plate by maintaining docking during the sliding process, and at the same time, multiple pressing block plates are slidably arranged on the pressing block crossbar, and multiple pressing block plates can move independently, adapting to different horizontal movement distances of multiple upper wedge plates.

4. The probe card wedge amplitude-modulation method of the present invention includes the following steps: Step a: determining the amplitude modulation width; Step b: moving the wedge; Step c: contacts connection; Step d: refresh probe testing connection. By moving the wedge, it can drive the probes to move, enabling the probe card to adjust the number of probes involved in testing based on the number of contacts to be tested, thereby achieving amplitude modulation of the probe card, enabling the adjustment of the testing amplitude of a single probe card to make the probe card universal.

In the FIGURES: 1. probe card main body; 2 upper wedge plate; 3 lower wedge plate; 4 amplitude-modulation structure; 1-1 main body frame; 1-2 probe slot; 1-3 upper wedge plate slot; 1-4 fixed contacts; 1-5 fixed block for the main body; 1-6 movable block for the main body; 1-7 spring for the movable block for the main body; 2-1 upper wedge plate body; 2-2 upper wedge plate wedge; 2-3 upper wedge plate probe; 2-4 upper wedge plate contact; 2-5 extension plate of the upper wedge plate; 2-6 upper wedge plate slider; 3-1 lower wedge plate body; 3-2 lower wedge plate wedge; 3-3 lower wedge plate probe; 3-4 lower wedge plate contact; 3-5 lower wedge plate slider; 4-1 pressing block plate; 4-2 pressing block plate pin; 4-3 pressing block plate pin groove; 4-4 pressing block crossbar; 4-5 crossbar slider; 4-6 crossbar spring; 4-7 crossbar slider screw rod; 4-8 first helical gear; 4-9 second helical gear; 4-10 transmission rod; 4-11 sliding gear; 4-12 sliding plate; 4-13 housing; 4-14 tooth roller; 4-15 sliding plate screw rod; 4-16 reset frame; 4-17 reset frame spring; 4-18 reset frame push rod; 5-1 pressing block disk; 5-2 pressing block disk ring; 5-3 pressing block disk ring groove; 5-4 pressing block disk rod; 5-5 pressing block disk stopper; 5-6 slide rest; 5-7 shell; 5-8 driving gear; 5-9 tooth roll shaft; 5-10 slide rest screw rod; 5-11 fixed rod; 5-12 fixed rod through hole; 5-13 outer frame; 5-14 outer frame spring; 100 testing areas; 200 testing circuit board.

SPECIFIC EMBODIMENT

The present invention will be explained in detail with the attached figures:

Embodiment 1

This embodiment is an embodiment of a wedge amplitude-modulation probe card.

Figure 1:
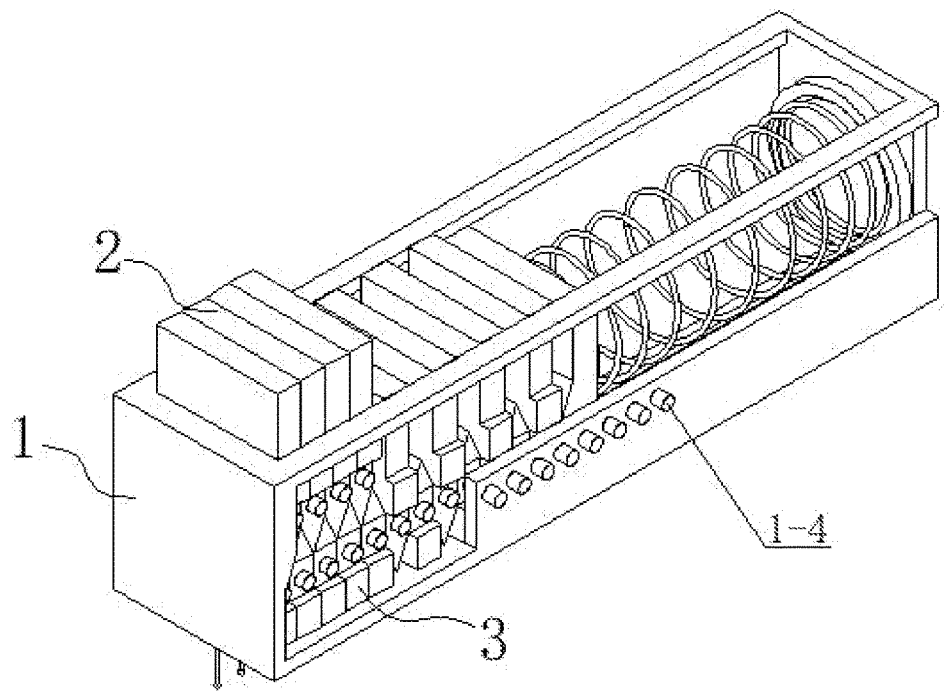
FIG. 1 is a schematic view of the overall structure of a wedge amplitude-modulating probe card.

As shown in FIG. 1, a wedge amplitude-modulation probe card comprises a probe card main body 1, upper wedge plates 2 and lower wedge plates 3. Several upper wedge plates 2 and several lower wedge plates 3 are slidably arranged inside the probe card main body 1, and the several upper wedge plates 2 and the several lower wedge plates 3 are sequentially arranged at intervals in a staggered manner; after the upper wedge plates 2 are moved downwards, the upper wedge plates 2 will push the lower wedge plates 3 to the right, causing the lower upper wedge plates 2 to join the queue of the lower wedge plates 3.

Figure 2:
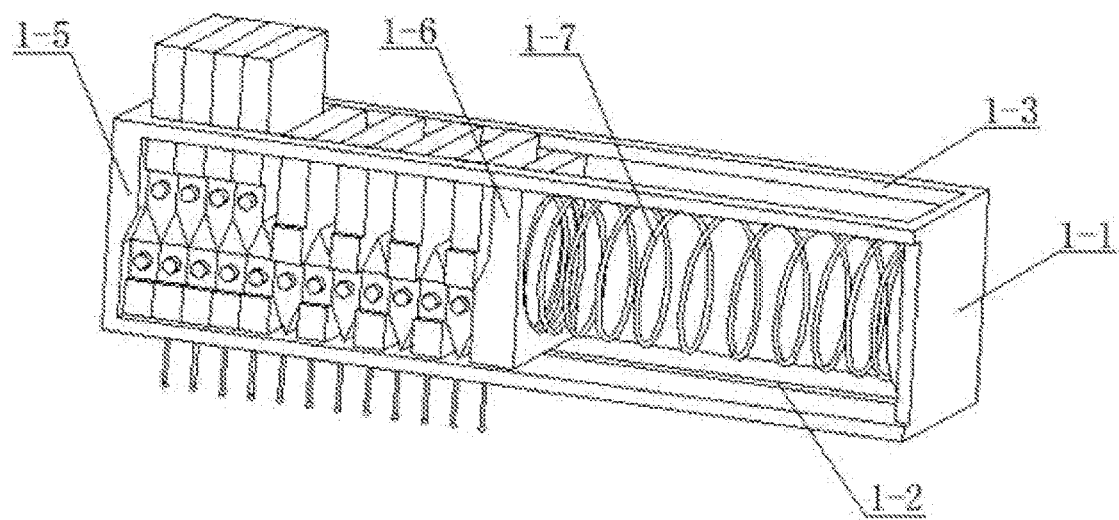
FIG. 2 is a schematic view of the lateral structure of a wedge amplitude-modulating probe card.

As shown in FIG. 2, the probe card main body 1 comprises a main body frame 1-1, a probe slot 1-2, and an upper wedge plate slot 1-3. The main body frame 1-1 internally accommodates several upper wedge plates 2 and lower wedge plates 3 along the length direction, and the bottom of the main body frame 1-1 is provided with a probe slot 1-2 for the probes to pass through along the length direction. The main body frame 1-1 is also provided with an upper wedge plate slot 1-3 for the upper wedge plates 2 to be exposed partially; the probe slot 1-2 allows the probes of upper wedge plates 2 and lower wedge plates 3 to be exposed from below the main body frame 1-1, and the width of upper wedge plate slot 1-3 is smaller than that of upper wedge plates 2, allowing the upper wedge plates 2 to be exposed partially, and the partially exposed upper wedge plates 2 facilitate the operation of moving the upper wedge plates 2 downwards.

Figure 3:
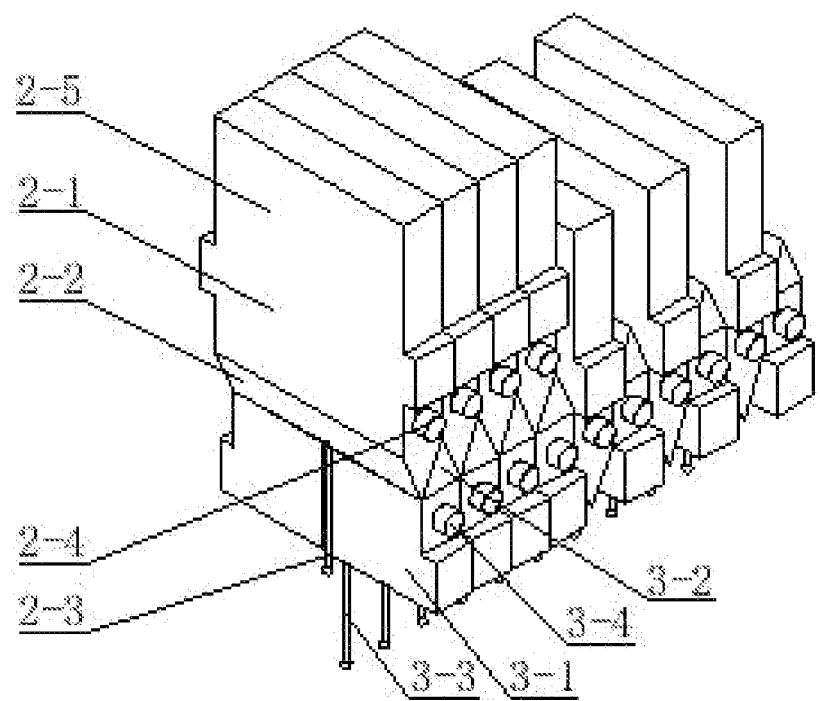
FIG. 3 is a schematic view of the upper wedge plate and the lower wedge plate.

As shown in FIG. 3, the upper wedge plate 2 comprises an upper wedge plate body 2-1, an upper wedge plate wedge 2-2, upper wedge plate probes 2-3, and upper wedge plate contacts 2-4. The lower end of the upper wedge plate body 2-1 is provided with an upper wedge plate wedge 2-2, and both sides of the upper wedge plate wedge 2-2 extend to the two sides of the upper wedge plate body 2-1. The lower end of the upper wedge plate wedge 2-2 is provided with upper wedge plate probes 2-3, and one end of the upper wedge plate contacts 2-4 is connected to the upper wedge plate probes 2-3, and the other end of the upper wedge plate contacts 2-4 is exposed from one side of the upper wedge plate body 2-1.

The lower wedge plate 3 comprises a lower wedge plate body 3-1, a lower wedge plate wedge 3-2, lower wedge plate probes 3-3, and lower wedge plate contacts 3-4. The upper end of the lower wedge plate body 3-1 is provided with a lower wedge plate wedge 3-3, and both sides of the lower wedge plate wedge 3-3 extend to the two sides of the lower wedge plate body 3-1. The lower end of the lower wedge plate wedge 3-1 is provided with lower wedge plate probes 3-3, and one end of the lower wedge plate contacts 3-4 is connected to the lower wedge plate probes 3-3, and the other end of the lower wedge plate contacts 3-4 are exposed from one side of the lower wedge plate body 3-1.

Before the upper wedge plates 2 are moved down, the upper wedge plate probes 2-3 are located above the queue of lower wedge plate probes 3-3 and are not involved in the testing. At the same time, the upper wedge plate probes 2-3 are located in the groove opened on the side of the lower wedge plate body 3-1, and the upper wedge plate contacts 2-4 are located above the queue of lower wedge plate contacts 3-4 and are not connected to the circuit. As shown in FIG. 1, the lower wedge plate contacts 3-4 in the queue of lower wedge plate contacts 3-4 are in contact with the fixed contacts 1-4 and are connected to the circuit.

After the upper wedge plates 2 are moved down, the upper wedge plate probes 2-3 are inserted into the queue of lower wedge plate probes 3-3 and involved in the testing. The upper wedge plate contacts 2-4 are inserted into the queue of lower wedge plate contacts 3-4 and are connected to the circuit. As shown in FIG. 1, the lower wedge plate contacts 3-4 in the queue of lower wedge plate contacts 3-4 and the upper wedge plate contacts 2-4 after movement down are in contact with the fixed contacts 1-4 and are connected to the circuit.

By inserting different numbers of upper wedge plates 2 into the queue of lower wedge plates 3, it can be realized that the corresponding number of upper wedge plate probes 2-3 inserted into the queue of lower wedge plate probes 3-3 can be increased, and then the number of probes involved in the testing can be changed to realize amplitude modulation, so that a single probe card has the function of amplitude modulation and avoid the operation of switching probe cards during the testing process.

The probe spacing required for the contacts to be tested is defined as the standard probe spacing. The thickness of the upper wedge plate body and the lower wedge plate body are standard probe spacing. After the upper wedge plates 2 are moved down into the queue of the lower wedge plates 3, it is ensured that the distance of the lower wedge plates 3 pushed to move horizontally to the right is a standard probe spacing is a standard probe spacing, which ensures that the upper wedge plate contacts 2-4 of the upper wedge plates 2 pushed down can be connected with the fixed contacts 1-4, and the lower wedge plate contacts 3-4 of the lower wedge plates 3 pushed down can be connected with the fixed contacts 1-4 and also ensures that the spacings between the probes involved in the testing are standard probe spacing after the upper wedge plates 2 are moved down. The probe card main body 1 is provided with several fixed contacts 1-4 at intervals at one side corresponding to the upper wedge plate contacts 2-4 and lower wedge plate contacts 2-3, and one end of the several fixed contacts 1-4 is connected with the testing circuit board 200, and the other end of the fixed contacts 1-4 extends to the interior of the main body frame 1-1, and the spacing between the adjacent fixed contacts 1-4 is the standard probe spacing.

Before amplitude modulation, the upper wedge plates 2 are located above the queue formed by the lower wedge plates 3, and the upper wedge plate wedge 2-2 of each upper wedge plate 2 is inserted between the lower wedge plate wedges 3-2 of two adjacent lower wedge plates 3 below it. By moving different numbers of upper wedge plates 2 down and inserting them into the queue formed by the lower wedge plates 3, the upper wedge plate probes 2-3 carried by the upper wedge plates 2 moved down are added to the queue formed by the lower wedge plate probes 3-3, thereby increasing the number of probes involved in the testing and achieving the purpose of amplitude modulation.

Figure 4:
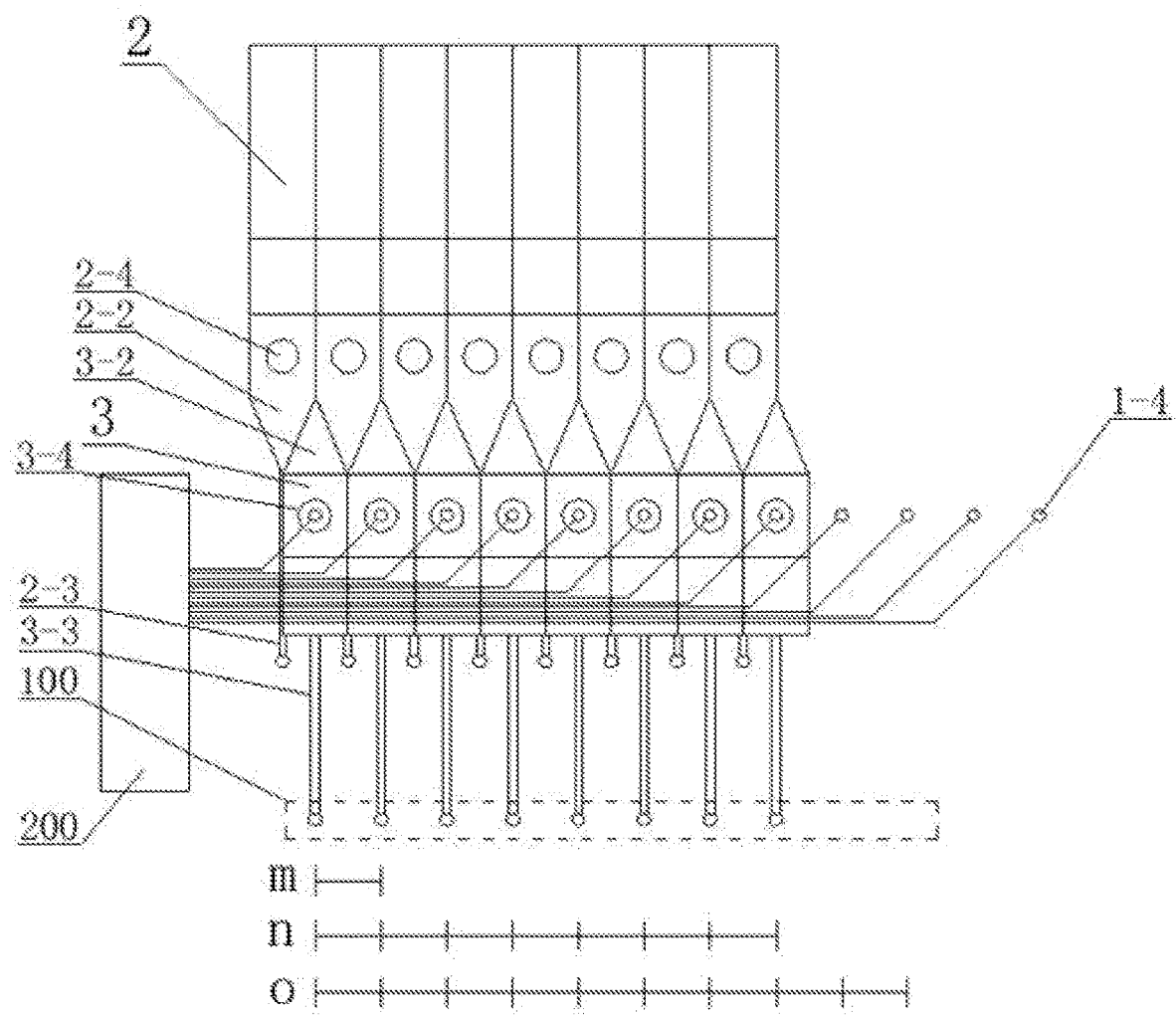
FIG. 4 is a view of the wedge position before amplitude modulation.
Figure 5:
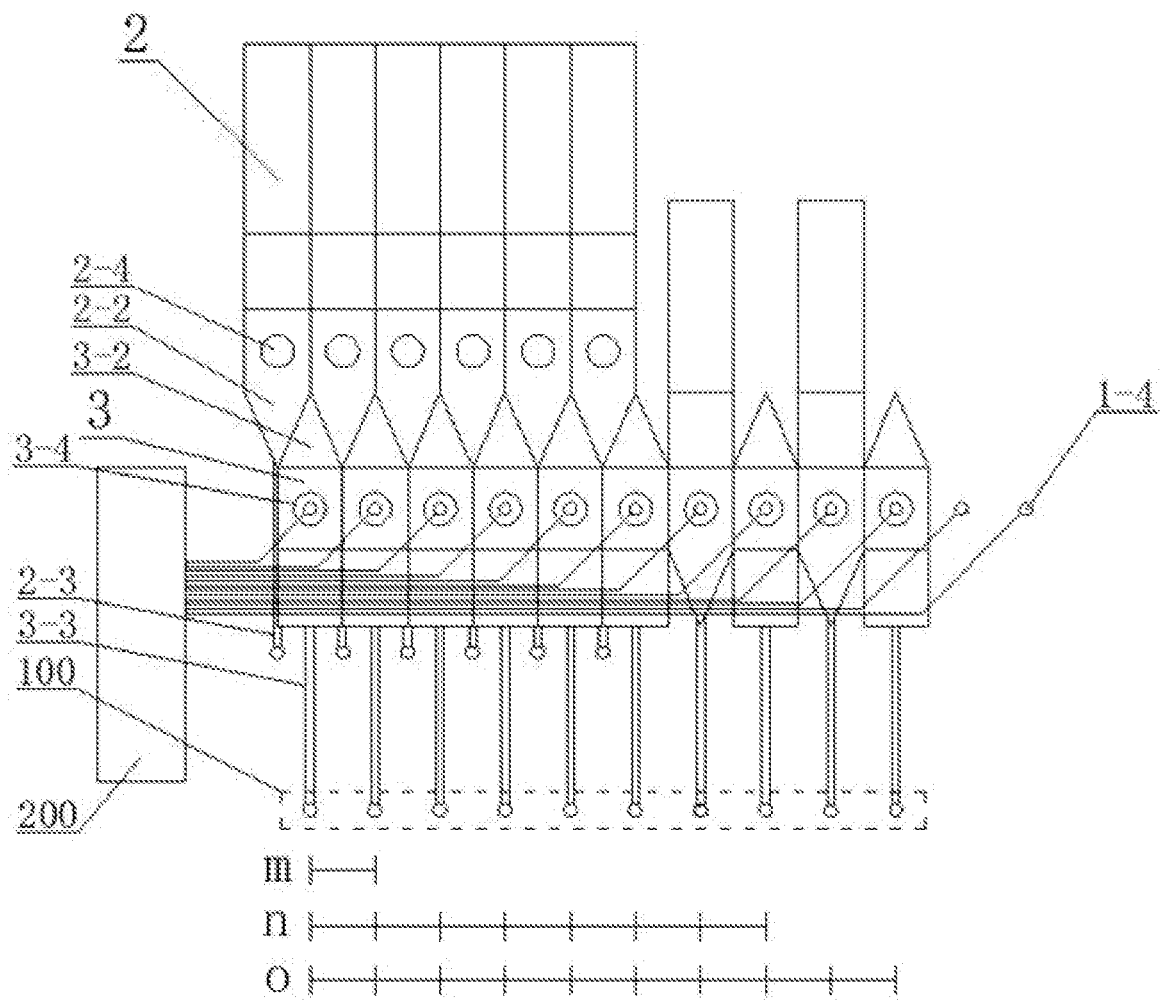
FIG. 5 is a view of the wedge position after amplitude modulation.

As shown in FIGS. 4 and 5, there is a process of reconnecting probes into the circuit during the amplitude modulation process. The fixed contacts 1-4 connected to the testing circuit board 200 are fixed on the side of the main body frame 1-1, and each fixed contact 1-4 extends into one end of the main body frame 1-1 to form a contact that allows an upper wedge plate body 2-1 or a lower wedge plate body 3-1 to access the testing circuit. By setting multiple fixed contacts 1-4 at intervals at the horizontal height where the lower wedge plate contacts 3-4 of the lower wedge plates 3 are located, so that the upper wedge plate contacts 2-4 of the upper wedge plates 2 higher than the height are not connected to the testing circuit before the movement, and the upper wedge plate contact 2-4 of the moved upper wedge plate 2 contacts a fixed contact 1-4 in the queue formed by the fixed contact 1-4. And the lower wedge plate contact 3-4 of the lower wedge plate 3 pushed by moving the upper wedge plate 2 downwards to slide to the right separates from the previously connected fixed contact 1-4 and contacts with another fixed contact 1-4 on the right after the movement of the upper wedge plate 2 downward is completed, and the unmoved upper wedge plate 2 remains unconnected to the testing circuit, and the moved upper wedge plate contact 2-4 of the upper wedge plate 2 moves downward and contacts with a fixed contact 1-4, and is connected to the testing circuit, and the lower wedge plate contact 3-4 of the unpushed lower wedge plate 3 remains contacted a fixed contact 1-4 and remains connected to the testing circuit, and the lower wedge plate contact 3-4 of the pushed lower wedge plate 3 separates from the originally contacted fixed contact 1-4 and moves to the right to contact with another fixed contact 1-4 on the right to be reconnected to the testing circuit.

Specifically, as shown in FIG. 2, the probe card main body 1 also comprises a fixed block for the main body 1-5, a movable block for the main body 1-6, and a spring for the movable block for the main body 1-7. One side of the main body frame 1-1 is provided with a fixed block for the main body 1-5, and the side of the fixed block for the main body 1-5 contacts one side of the several upper wedge plates 2 and lower wedge plates 3 sequentially arranged at intervals in a staggered manner; and the other side of the main body frame 1-1 is slidably provided with a movable block for the main body 1-6, and the side of the movable block for the main body 1-6 contacts the other side of the several upper wedge plates 2 and lower wedge plates 3 sequentially arranged at intervals in a staggered manner; and the movable block for the main body 1-6 is connected to the probe card main body 1 through the spring for the movable block for the main body 1-7.

The fixed block for the main body 1-5 and the movable block for the main body 1-6, under the action of the spring for the movable block for the main body 1-7, clamp the queue formed by the upper wedge plate 2 and the lower wedge plate 3 to ensure the upper wedge plate 2 to move down and insert, and the lower wedge plate 3 slides horizontally to stabilize.

Specifically, as shown in FIG. 3, the upper wedge plate 2 also comprises an extension plate of the upper wedge plate 2-5, and the extension plate of the upper wedge plate 2-5 is formed by extending the upper end of the upper wedge plate body 2-1 upwards, and the extension plate of the upper wedge plate 2-5 passes through the upper wedge plate slot 1-3 and extends to the outside of the probe card main body 1.

Since the extension plate of the upper wedge plate 2-5 extends to the outside of the probe card main body 1, during amplitude modulation, the extension plate of the upper wedge plate 2-5 can be pressed down, so that the upper wedge plate 2 can be moved down and inserted in the queue formed by the lower wedge plate 3.

Specifically, as shown in FIG. 3, the upper wedge plate 2 also comprises an upper wedge plate slider 2-6, and the upper wedge plate body 2-1 is provided with an upper wedge plate slider 2-6 on both sides respectively, and the upper wedge plate sliders 2-1 are slidably connected to the inner wall of the probe card main body 1.

Specifically, as shown in FIG. 3, the lower wedge plate 3 also comprises a lower wedge plate slider 3-5, and the lower wedge plate body 3-1 is provided with a lower wedge plate slider 3-5 on both sides respectively, and the lower wedge plate sliders 3-5 are slidably connected to the inner wall of the probe card main body 1.

Specifically, as shown in FIG. 2, an amplitude-modulation structure 4 is arranged above the probe card main body 1, and the amplitude-modulation structure 4 comprises a pressing block. The pressing block is arranged above the exposed part of the upper wedge plate 2 on the probe card main body 1, and the pressing block can press down on the exposed part of a single or multiple upper wedge plates 2, causing the upper wedge plate 2 to move downward.

During the amplitude modulation, the amplitude modulation of different amplitudes can be realized by moving down different numbers of the upper wedge plates 2, and the pressing block is moved by the amplitude modulation structure 4, so that the pressing block covers different numbers of the upper wedge plates 2 along the direction from right to left, The pressing block is moved down by the amplitude modulation structure 4, and then the upper wedge plates 2 of different numbers are moved down to realize the amplitude modulation of different amplitudes.

Embodiment 2

This embodiment is an embodiment of a wedge amplitude-modulation probe card main body.

The wedge amplitude-modulation probe card main body disclosed in this embodiment is applied to the wedge amplitude-modulation probe card of the embodiment.

As shown in FIG. 1 to 3, a wedge amplitude-modulation probe card main body, and several upper wedge plates 2 and several lower wedge plates 3 are slidably arranged inside the probe card main body 1, and the several upper wedge plates 2 and the several lower wedge plates 3 are sequentially arranged at intervals in a staggered manner; the probe card main body 1 comprises a main body frame 1-1, a probe slot 1-2, and an upper wedge plate slot 1-3. The main body frame 1-1 internally accommodates several upper wedge plates 2 and lower wedge plates 3 along the length direction, and the bottom of the main body frame 1-1 is provided with a probe slot 1-2 for the probes to pass through along the length direction. The main body frame 1-1 is also provided with an upper wedge plate slot 1-3 for the upper wedge plates 2 to be exposed partially; one side of the main body frame 1-1 is provided with several fixed contacts 1-4 at intervals at one side, and one end of the several fixed contacts 1-4 is connected with the testing circuit board, and the other end of the fixed contacts 1-4 extends to the interior of the main body frame 1-1; the probe card main body 1 also comprises a fixed block for the main body 1-5, a movable block for the main body 1-6, and a spring for the movable block for the main body 1-7. One side of the main body frame 1-1 is provided with a fixed block for the main body 1-5, and the side of the fixed block for the main body 1-5 contacts one side of the several upper wedge plates 2 and lower wedge plates 3 sequentially arranged at intervals in a staggered manner; and the other side of the main body frame 1-1 is slidably provided with a movable block for the main body 1-6, and the side of the movable block for the main body 1-6 contacts the other side of the several upper wedge plates 2 and lower wedge plates 3 sequentially arranged at intervals in a staggered manner; and the movable block for the main body 1-6 is connected to the probe card main body 1 through the spring for the movable block for the main body 1-7.

In the probe card that uses wedges for amplitude modulation, the probe card main body needs to fix the upper wedge plate 2 and the lower wedge plate 3 to ensure that the upper wedge plate 2 can slide down and slide to the right, and the lower wedge plate 3 can slide to the right and be reconnected to the circuit after movement.

Through the fixed block for the main body 1-5 and the movable block for the main body 1-6, under the action of the spring for the movable block for the main body 1-7, the formation of the upper wedge plate 2 and the lower wedge plate 3 is clamped to ensure the upper wedge plate. 2 to move down and insert, and the lower wedge plate 3 is stably sliding horizontally. The upper wedge plate groove 1-3 can partially expose the upper wedge plate 2, which facilitates the downward movement of the upper wedge plate 2. A number of fixed contacts 1-4 are arranged at intervals on one side of the main body frame 1-1. After the movement, the upper wedge plate contacts 2-4 of the moved upper wedge plate 2 contacts a fixed contact 1-4 in the queue formed by the fixed contact 1-4. And the lower wedge plate contact 3-4 of the lower wedge plate 3 pushed by moving the upper wedge plate 2 downward to slide to the right separates from the previously connected fixed contact 1-4 and contacts with another fixed contact 1-4 on the right after the movement of the upper wedge plate 2 downward is completed.

Embodiment 3

This embodiment is an embodiment of a wedge probe card amplitude-modulation method.

The embodiment discloses a probe card wedge amplitude-modulation method, and it is applied to a wedge amplitude-modulation probe card disclosed in embodiment 1.

As shown in FIGS. 4 and 5, a probe card wedge amplitude-modulation method includes the following steps:

Step a: Determine the amplitude modulation distance: Before amplitude modulation, several upper wedge plates 2 contact laterally and several lower wedge plates 3 contact laterally. The upper wedge plate wedge 2-2 at the lower end of the upper wedge plate 2 is embedded between the lower wedge plate wedges 3-2 of two adjacent lower wedge plates 3 below it, and the upper wedge plate probes 2-3 of each upper wedge plate 2 are located above the testing area 100, and the lower wedge plate probes 3-3 of each lower wedge plate 3 are located in the testing area 100, and the upper wedge plate contacts 2-4 of each upper wedge plate 2 are located above several fixed contacts 1-4, and the lower wedge plate contacts 3-4 of each lower wedge plate 3 contact several fixed contacts 1-4 in a direction from left to right. The probe spacing in the testing area 100 is defined as (m), which is the unit distance corresponding to the distance between the contacts to be tested. The width of the lower wedge plate probe 3-3 of each lower wedge plate 3 located in the testing area 100 is the basic amplitude (n), and the width of the contacts to be tested in the testing area 100 is the amplitude to be tested (o). The difference value between the amplitude to be tested (o) and the basic amplitude (n) is obtained as the amplitude modulation distance that is an integer multiple of the probe spacing (m);

Step b: Move the wedge: The amplitude modulation distance obtained by the amplitude modulation distance determined through step a is a multiple of the probe spacing (m). As the number of moving upper wedge plates 2, the upper wedge plates 2 corresponding to the multiple are moved downward in the direction from right to left. The upper wedge plate wedges 2-2 at the lower end of the upper wedge plate 2 are inserted between the two adjacent lower wedge plates 3 below it until the upper wedge plate probes 2-3 at the lower end of the upper wedge plate 2 enter the testing area 100, and at the same time, the lower wedge plate 3 on the right side of the moved upper wedge plate 2 is pushed to move to the right;

Step c: Contacts connection: When the upper wedge plate 2 is moved, the upper wedge plate contacts 2-4 of the moved upper wedge plate 2 move downward to the horizontal height of several fixed contacts 1-4 from the upper direction, and contact with one of the fixed contacts 1-4. The lower wedge plate contacts 3-4 of the pushed lower wedge plate 3 are separated from the fixed contacts 1-4 of the original contacts, and contact with one of the fixed contacts 1-4 on the right;

Step d: Refresh probe testing connection: The testing circuit board 200 is electrically reconnected to the lower wedge plate probes 3-3 on the fixed lower wedge plate 3, the lower wedge plate probes 3-3 on the pushed lower wedge plate 3, and the upper wedge plate probes 2-3 at the lower end of the moved upper wedge plate 2 through several fixed contacts 1-4.

Specifically, in step a, the thicknesses of the upper wedge plate 2 and lower wedge plate 3 are both set to be the probe spacing (m) during the determination of the amplitude modulation distance.

Specifically, in step b, when the wedge is moved, the moved upper wedge plate 2 moves downward to an area where its side overlaps with the lower wedge plate 3.

Specifically, a wedge amplitude modulation probe card is used for amplitude modulation.

Specifically, the wedge amplitude-modulation probe card comprises a probe card main body 1, upper wedge plates 2 and lower wedge plates 3. Several upper wedge plates 2 and several lower wedge plates 3 are slidably arranged inside the probe card main body 1 and the several upper wedge plates 2 and the several lower wedge plates 3 are sequentially arranged at intervals in a staggered manner.

By inserting different numbers of upper wedge plates 2 into the queue of lower wedge plates 3, it can be realized that the corresponding number of upper wedge plate probes 2-3 inserted into the queue of lower wedge plate probes 3-3 can be increased, and then the number of probes involved in the testing can be changed to realize amplitude modulation, so that a single probe card has the function of amplitude modulation and avoid the operation of switching probe cards during the testing process.

Embodiment 4

This embodiment is an embodiment of an amplitude-modulation structure of a wedge amplitude-modulation probe card.

An amplitude-modulation structure of a wedge amplitude-modulation probe card disclosed in this embodiment is applied to the wedge amplitude-modulation probe card disclosed in the embodiment 1, and can move a single or multiple upper wedge plates 2 down during amplitude-modulation and ensure stability during the movement.

Figure 6:
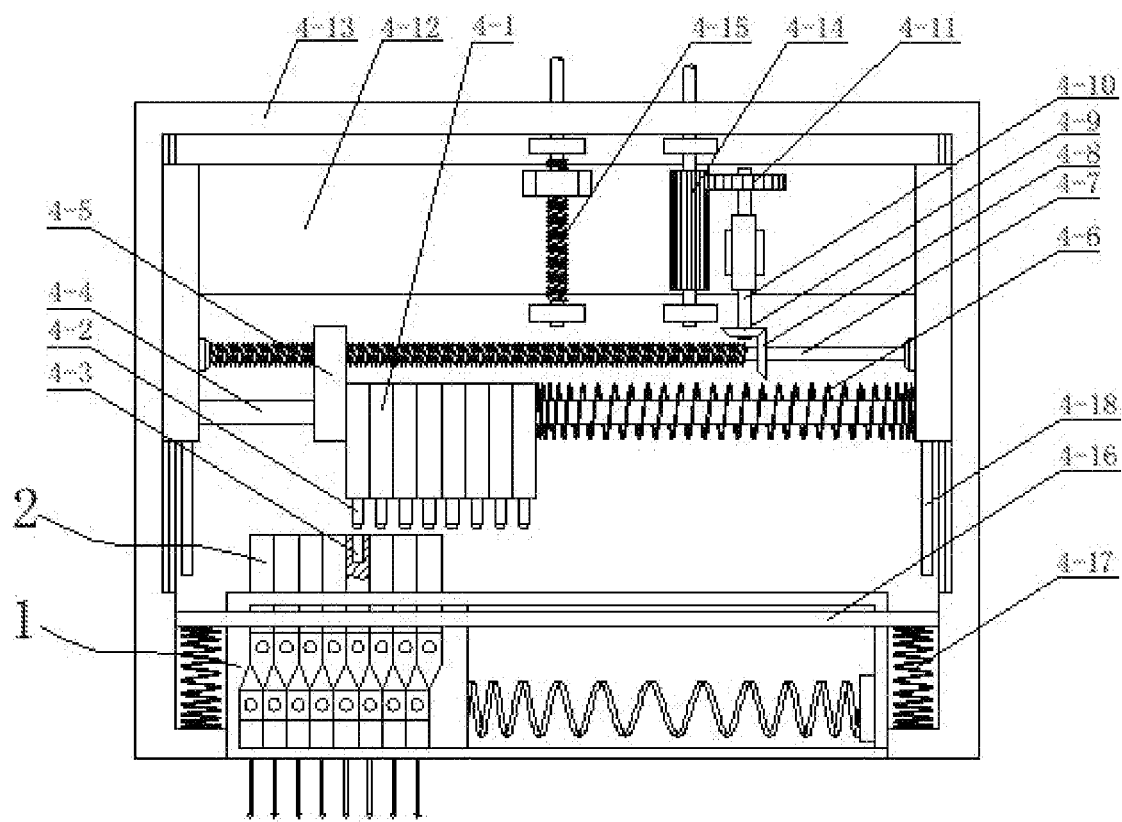
FIG. 6 is a view of the amplitude-modulation structure before amplitude modulation.
Figure 7:
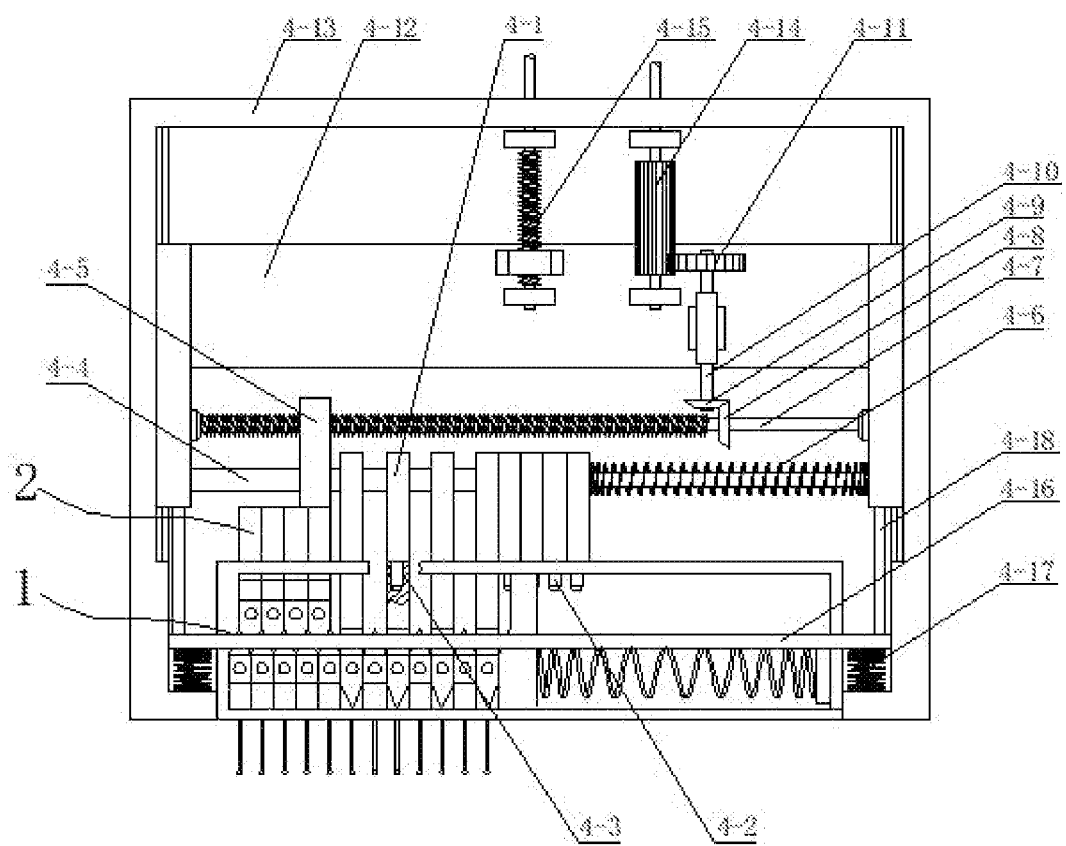
FIG. 7 is a view of the amplitude-modulation structure after amplitude modulation.

As shown in FIGS. 6 and 7, the amplitude-modulation structure of a wedge amplitude-modulation probe card is arranged above the probe card main body 1, and it comprises a pressing block. The pressing block is arranged above the exposed part of the upper wedge plate 2 on the probe card main body 1, and the pressing block can press down on the exposed part of a single or multiple upper wedge plates 2, causing the upper wedge plate 2 to move downward; by moving the pressing block left and right, different numbers of upper wedge plates are covered under the pressing block 2. The selection of the number of the upper wedge plates 2 to be moved is realized. By moving the pressing block downward, the upper wedge plates 2 of the same number can be moved downward.

The amplitude modulation structure also comprises: a pressing block plate 4-1, a pressing block plate pin 4-2, a pressing block plate pin groove 4-3, a pressing block crossbar 4-4, a crossbar slider 4-5, a crossbar spring 4-6, a crossbar slider screw rod 4-7, first helical gear 4-8, second helical gear 4-9, a transmission rod 4-10, a sliding gear 4-11, a sliding plate 4-12, a housing 4-13, a tooth roller 4-14 and a slide screw rod 4-15.

Several pressing block plates 4-1 are parallelly and slidably arranged on the pressing block crossbar 4-4 to form a pressing block, and the pressing block is formed by a plurality of pressing block plates 4-1, and the number of pressing block plates 4-1 corresponds to the number of upper wedge plates 2.

The lower end of each pressing block plate 4-1 is provided with a pressing block plate pin 4-2, and the upper end of each upper wedge plate 2 is provided with a pressing block plate pin groove 4-3; After the movement of pressing block plate 4-1 downward, it can be inserted into the pressing block plate pin groove 4-3 through the pressing block plate pin 4-2, so that the pressing block plate 4-1 and the pressing block plate pin groove 4-3 establish a temporary connection to avoid shaking of the upper wedge plates 2 during the downward movement process.

The pressing block crossbar 4-4 on the left side of the pressing block is slidably provided with a crossbar slider 4-5, and the pressing block crossbar 4-4 on the right side of the pressing block is sleeved with a crossbar spring 4-6, and the cross-section of the pressing block crossbar 4-4 is rectangular; by clamping the crossbar slider 4-5 and the crossbar spring 4-6, the pressing blocks formed by the plurality of pressing block plates 4-1 can move with the crossbar slider 4-5. By moving the crossbar slider 4-5, the pressing block can be moved left and right, so that the pressing block can cover different numbers of the upper wedge plates 2, and the selection of the number of the upper wedge plates 2 to be moved is realized.

The upper end of the crossbar slider 4-5 is sleeved on the crossbar slider screw rod 4-7, and the crossbar slider screw rod 4-7 is rotated to drive the crossbar slider 4-5 to move, and adjust the position of the pressing block.

The crossbar slider screw rod 4-7 is fixedly equipped with the first helical gear 4-8, and the first helical gear 4-8 meshes with the second helical gear 4-9, and the second helical gear 4-9 is fixedly connected to the lower end of the transmission rod 4-10, and the upper end of the transmission rod 4-10 is fixedly connected to a sliding gear 4-11, and the middle of the transmission rod 4-10 is rotationally connected to the sliding plate 4-12 to drive the pressing block to move upward and downward through the sliding plate 4-12 to realize the downward movement of the pressing block. The meshing the sliding gear 4-11 with the tooth roller 4-14 drives the sliding plate 4-12 to slide and sliding gear 4-11 and the tooth roller 4-14 keep meshed during sliding. The sliding gear 4-11 are coaxial connected with the tooth roller 4-14 and are used to drive the horizontal movement of the pressing block. When the pressing block moves in the vertical direction, it avoids moving with the sliding plate 4-12.

The sliding plate 4-12 is slidably arranged inside the housing 4-13, and the housing 4-13 is fixedly connected to the probe card main body 1. The two ends of the crossbar slider screw rod 4-7 are respectively rotationally connected to the sliding plate 4-12, and the two ends of the pressing block crossbar 4-4 are fixedly connected to the sliding plate 4-12, and the sliding gear 4-11 meshes with the tooth roller 4-14, and both ends of the tooth roller 4-14 are rotationally connected to the housing 4-13, and the middle of the sliding plate 4-12 is sleeved on the sliding plate screw rod 4-15, and both ends of the sliding plate screw rod 4-15 are rotationally connected to the housing 4-13.

By rotating the tooth roller 4-14, the sliding gear 4-11 is driven to rotate, so that the transmission rod 4-10 drives the crossbar slider screw rod 4-7 to rotate through the first helical gear 4-8 and the second helical gear 4-9. The crossbar slider screw rod 4-7 drives the crossbar slider 4-5 to move horizontally, and adjusts the number of upper wedge plates 2 covered by the pressing block. After the adjustment is completed, the sliding plate screw rod 4-15 is rotated to slide the sliding plate 4-12 downwards, while the sliding gear 4-11 slides downwards on the surface of the tooth roller 4-14 and maintain the meshed state, and the sliding plate 4-12 drives the pressing block plate 4-1 to move down, and the pressing block plate pin 4-2 at the lower end of the pressing block plate 4-11 is inserted into the pressing block plate pin groove 4-3, so that the pressing block plate 4-1 and the pressing block plate pin groove 4-3 establish a temporary connection relationship. And the upper wedge plate 2 is inserted into the queue of the lower wedge plate 3, and the upper wedge plate 2 slides to the right during the downward movement, and the pressing block plate 4-1 connected with the upper wedge plate 2 slides to the right on the pressing block crossbar 4-4 along with the upper wedge plate 2 during the downward movement.

Specifically, as shown in FIGS. 6 and 7, it also comprises a reset frame 4-16 and a reset frame spring 4-17. The reset frame 4-16 is sleeved on the outer side of the probe card main body 1, and a reset frame spring 4-17 is arranged between the lower end of the reset frame 4-16 and the inner wall of the housing 4-13. The upper wedge plate slider 2-6 of the upper wedge plate 2 overlaps the upper end of the reset frame 4-16. When the upper wedge plate 2 moves down, the upper wedge plate slider 2-6 of the upper wedge plate 2 presses down the reset frame 4-16 to compress the reset frame spring 4-17, and the elastic potential energy accumulated by the reset frame spring 4-17 can push the reset frame 4-16 to move upward after the upward movement of the pressing block, and the reset frame 4-16 can push the upper wedge plate 2 to move up and reset.

Specifically, it also comprises a reset frame push rod 4-18, and the upper end of the reset frame push rod 4-18 is fixedly connected to the sliding plate 4-12, and the lower end of the reset frame push rod 4-18 is suspended above the reset frame 4-16. When the sliding plate 4-12 moves down, the reset frame 4-16 is pushed to move by the reset frame push rod 4-18, so as to avoid the reset frame 4-16 being pushed by the upper wedge plate slider 2-6 of the upper wedge plate 2 and avoid the friction resistance generated between the upper wedge plate slider 2-6 of the upper wedge plate 2 and the reset frame 4-16, so that the sliding of the upper wedge plate 2 is more stable.

Specifically, it is applied to a wedge amplitude-modulation probe card.

Specifically, the wedge amplitude-modulation probe card comprises a probe card main body 1, upper wedge plates 2 and lower wedge plates 3. Several upper wedge plates 2 and several lower wedge plates 3 are slidably arranged inside the probe card main body, 1 and the several upper wedge plates 2 and the several lower wedge plates 3 are sequentially arranged at intervals in a staggered manner;

The probe card main body 1 comprises a main body frame 1-1, a probe slot 1-2, and an upper wedge plate slot 1-3. The main body frame 1-1 internally accommodates several upper wedge plates 2 and lower wedge plates 3 along the length direction, and the bottom of the main body frame 1-1 is provided with a probe slot 1-2 for the probes to pass through along the length direction. The main body frame 1-1 is also provided with an upper wedge plate slot 1-3 for the upper wedge plates 2 to be exposed partially.

Embodiment 5

This embodiment is an embodiment of the docking structure of the amplitude-modulation structure of a wedge amplitude-modulation probe card.

The embodiment discloses the docking structure of the amplitude-modulation structure of a wedge amplitude-modulation probe card, and the docking structure is applied to the amplitude-modulation structure of a wedge amplitude-modulating probe card disclosed in embodiment 4.

As shown in the FIGS. 6 and 7, the docking structure of the amplitude-modulation structure of a wedge amplitude-modulation probe card comprises a pressing block plate 4-1, a pressing block plate pin 4-2, a pressing block plate pin groove 4-3, a pressing block crossbar 4-4, a crossbar slider 4-5, a crossbar spring 4-6, a crossbar slider screw rod 4-7, a first helical gear 4-8, a second helical gear 4-9, a transmission rod 4-10, a sliding gear 4-11, a sliding plate 4-12, a housing 4-13, a tooth roller 4-14, and a sliding plate screw rod 4-15. Several pressing block plates 4-1 are parallelly and slidably arranged on the pressing block crossbar 4-4 to form a pressing block, and the lower end of each pressing block plate 4-1 is equipped with a pressing block plate pin 4-2, and each upper wedge plate 2 is equipped with a pressing block plate pin groove 4-3 at the upper end, and the pressing block crossbar 4-4 on the left side of the pressing block is slidably provided with a crossbar slider 4-5, and the pressing block crossbar 4-4 on the right side of the pressing block is sleeved with a crossbar spring 4-6, and the cross-section of the pressing block crossbar 4-4 is rectangular.

The pressure block formed by a plurality of slidably arranged pressing block plates 4-1 can be connected to the upper wedge plate 2 through the pressing block plate 4-1 when the pressing block presses down the upper wedge plate 2, so as to ensure the stability when the upper wedge plate 2 slides. At the same time, the pressing block plate 4-1 can slide down synchronously with the docked upper wedge plate 2 and remain connected during the sliding to the right, so that during the whole sliding process, the upper wedge plate 2 can maintain the sliding stability through the connection of the pressing block plate 4-1.

Embodiment 6

This embodiment is an embodiment of an amplitude-modulation piece of a wedge amplitude-modulation probe card.

An amplitude-modulation piece of a wedge amplitude-modulation probe card disclosed in this embodiment is applied to the wedge amplitude-modulation probe card disclosed in the embodiment 1, and can move a single or multiple upper wedge plates 2 down during amplitude-modulation and ensure stability during the movement.

Figure 8:
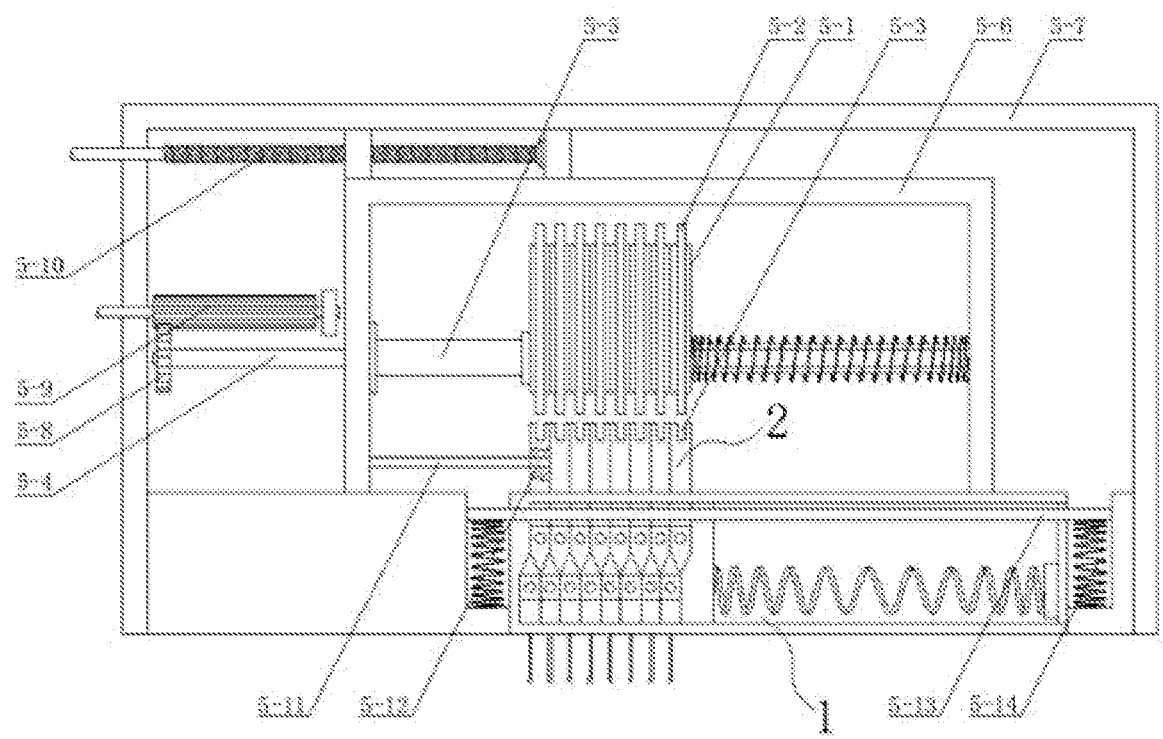
FIG. 8 is a view of the amplitude-modulation piece before amplitude modulation.
Figure 9:
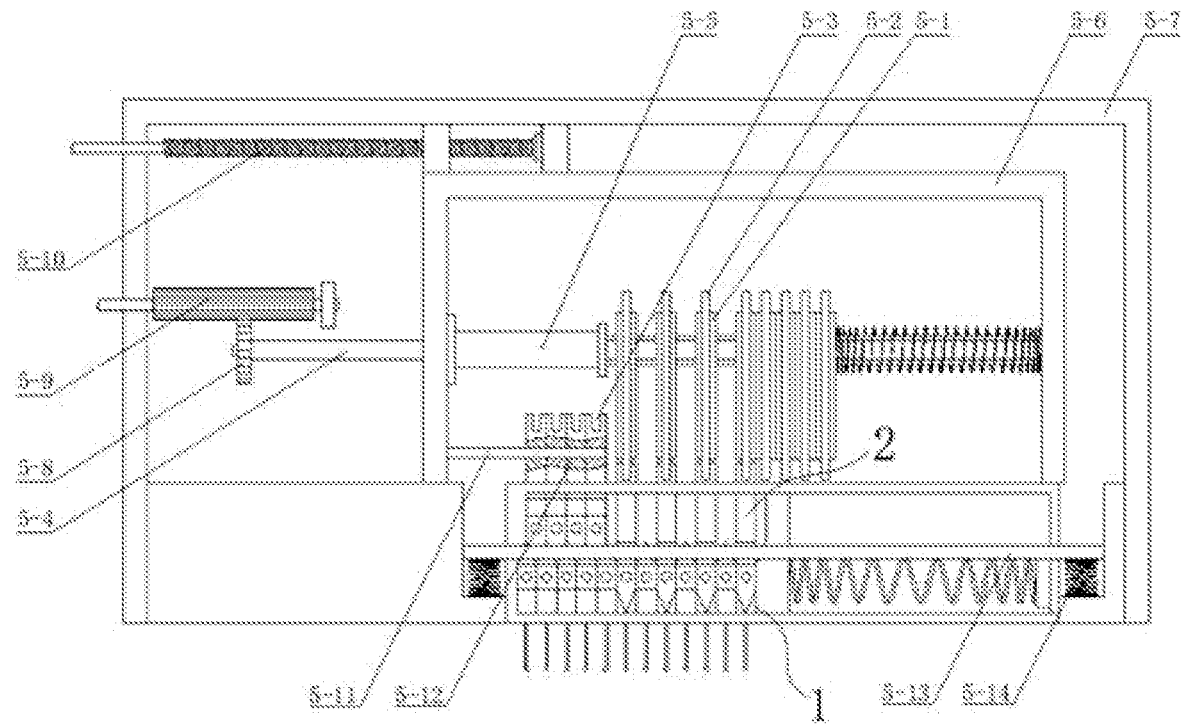
FIG. 9 is a view of the amplitude-modulation piece after amplitude modulation.

As shown in FIGS. 8 and 9, the amplitude-modulation piece of a wedge amplitude-modulation probe card is arranged above the probe card main body 1, and it comprises a pressing block. The pressing block is arranged above the exposed part of the upper wedge plate 2 on the probe card main body 1, and the pressing block can press down on the exposed part of a single or multiple upper wedge plates 2, causing the upper wedge plate 2 to move downward; by moving the pressing block left and right, different numbers of upper wedge plates are covered under the pressing block 2. The selection of the number of the upper wedge plates 2 to be moved is realized. By moving the pressing block downward, the upper wedge plates 2 of the same number can be moved downward.

The amplitude-modulation piece also comprises a pressing block disk 5-1, a pressing block disk ring 5-2, a pressing block disk ring groove 5-3, a pressing block disk rod 5-4, a pressing block disk stopper 5-5, a slide rest 5-6, a shell 5-7, a driving gear 5-8, a tooth roll shaft 5-9, a slide rest screw rod 5-10, a fixed rod 5-11 and a fixed rod through hole 5-12.

Several pressing block disks 5-1 are parallelly and slidably arranged on the pressing block disk rod 5-4 to form a pressing block, and the pressing block disk is formed by a plurality of pressing block plates 5-1, and the number of pressing block disks 5-1 corresponds to the number of upper wedge plates 2.

Several pressing block disks 5-1 are eccentrically arranged on the pressing block disk rod 5-4, and the outer part of each pressing block disk 5-1 is fixed with a pressing block disk ring 5-2, and the upper end of each upper wedge plate 2 is equipped with a pressing block disk ring groove 5-3, and after the rotation of the pressing block disk 5-1, due to the eccentric setting of the pressing block disk 5-1, it can be inserted into the pressing block disk ring groove 5-3 through the pressing block disk ring 5-2, so that the pressing block disk 5-1 and the pressing block disk ring groove 5-3 establish a temporary connection to avoid shaking of the upper wedge plates 2 during the downward movement process.

The pressing block disk rod 5-4 on the left side of the pressing block is sleeved with a pressing block disk stopper 5-5, and the pressing block disk rod 5-4 on the right side of the pressing block is sleeved with a disk rod spring 5-6, the side of the pressing block disk rod 5-4 is provided with a guide bar along the axial direction; the pressing block disk stopper 5-5 blocks the pressing block from the left side, and serves as the starting point for the pressing block to cover the area of the upper wedge plate 2. The disk rod spring 5-6 blocks the pressing block from the right side, and can be reset after the pressing block plate 5-1 in the pressing block slides to the right.

The left end of the pressing block disk stopper 5-5 is fixedly connected to the slide rest 5-6, and the slide rest 5-6 is slidably set inside the shell 5-7. Through the sliding of the slide rest 5-6, it drives the pressing block to move left and right, thereby achieving the coverage of different numbers of upper wedge plates 2 by the pressing block, and achieving the selection of the number of upper wedge plate 2 to be moved.

The shell 5-7 is fixedly arranged on the probe card main body 1, the right end of the pressing block disk rod 5-4 is rotationally connected to the slide rest 5-6, and the left end of the pressing block disk rod 5-4 passes through the pressing block disk stopper 5-5 and the side wall of the slide rest 5-6 sequentially to be fixedly connected to the driving gear 5-8, and the driving gear 5-8 engages with the tooth roll shaft 5-9, and both ends of the tooth roll shaft 5-9 are rotationally connected to the shell 5-7, and the tooth roller shaft 5-9 is coaxially connected with a downward pressing rotating shaft, which passes through the shell 5-7 and serves as the operating shaft for driving the pressing block to move down.

The upper end of the slide rest 5-6 is sleeved on the slide rest screw rod 5-10, and both ends of the slide rest screw rod 5-10 are rotationally connected to the shell 5-7; the slide rest screw rod 5-10 is coaxially connected with an adjustment shaft, which passes through the shell 5-7 and serves as the operating shaft for driving the pressing block to move left and right.

One end of the fixed rod 5-11 is fixedly connected to the left end of the slide rest 5-6, the other end of the fixed rod 5-11 is suspended in the air, and the exposed part of the upper wedge plate 2 is provided with a fixed rod through hole 5-12 corresponding to the fixed rod 5-11; when the pressing block moves left and right, the fixed rod 5-11 can pass through the fixed rod through hole 5-12 of the upper wedge plate 2 uncovered by the pressing block, so as to fix the uncovered upper wedge plate 2 and avoid the movement of uncovered upper wedge plate 2.

By rotating the slide rest screw rod 5-10, the slide rest 5-6 is driven to move horizontally, and the slide rest 5-6 drives the pressing block to move horizontally, and the horizontal position of the pressing block is adjusted to realize that the pressing block covers different numbers of upper wedge plates 2, and at the same time, when the pressing block moves horizontally, the fixed rod 5-11 moves with the slide rest 5-6, and passes through the fixed rod through hole 5-12 of the upper wedge plate 2 uncovered by the pressing block to fix the upper wedge plate 2 uncovered by the pressing block. And the driving gear 5-8 slides on the surface of the tooth roll shaft 5-9 and keeps meshed; after the pressing block is adjusted to the horizontal position, the driving gear 5-8 is driven by rotating the tooth roll shaft 5-9 to make the pressing block disk rod 5-4 rotate, and the pressing block disk rod 5-4 drives the pressing block disk 5-1 to rotate. Due to the eccentric setting of the pressing block disk 5-1, the lower edge of the pressing block disk 5-1 contacts with the upper end of the upper wedge plate 2. And at the same time, the pressing block disk ring 5-2 is inserted into the pressing block disk ring groove 5-3 to establish a temporary connection of the pressing block disk 5-1 and upper wedge plate 2. As the pressing plate 5-1 rotates, the pressing plate 5-1 pushes down the upper wedge plate 2, and the upper wedge plate 2 slides down and to the right, inserting it into the queue of the lower wedge plate 3 to achieve amplitude modulation.

Specifically, it also comprises an outer frame 5-13 and an outer frame spring 5-14. The outer frame 5-13 is sleeved on the outer side of the probe card main body 1, and an outer frame spring 5-14 is arranged between the lower end of the outer frame 5-13 and the inner wall of the shell 5-7. The upper wedge plate slider 2-6 of the upper wedge plate 2 overlaps the upper end of the outer frame 5-13. When the upper wedge plate 2 moves down, the upper wedge plate slider 2-6 of the upper wedge plate 2 presses down the outer frame 5-13 to compress the outer frame spring 5-14, and the elastic potential energy accumulated by the outer frame spring 5-14 can push the outer frame 5-13 to move upward after the upward movement of the pressing block, and the outer frame 5-13 can push the upper wedge plate 2 to move up and reset.

Specifically, it is applied to a wedge amplitude-modulation probe card.

Specifically, the wedge amplitude-modulation probe card comprises a probe card main body 1, upper wedge plates 2 and lower wedge plates 3. Several upper wedge plates 2 and several lower wedge plates 3 are slidably arranged inside the probe card main body, 1 and the several upper wedge plates 2 and the several lower wedge plates 3 are sequentially arranged at intervals in a staggered manner;

The probe card main body 1 comprises a main body frame 1-1, a probe slot 1-2, and an upper wedge plate slot 1-3. The main body frame 1-1 internally accommodates several upper wedge plates 2 and lower wedge plates 3 along the length direction, and the bottom of the main body frame 1-1 is provided with a probe slot 1-2 for the probes to pass through along the length direction. The main body frame 1-1 is also provided with an upper wedge plate slot 1-3 for the upper wedge plates 2 to be exposed partially.

Embodiment 7

This embodiment is an embodiment of the docking structure of the amplitude-modulation piece of a wedge amplitude-modulation probe card.

The embodiment discloses the docking structure of the amplitude-modulation piece of a wedge amplitude-modulation probe card, and the docking structure is applied to the amplitude-modulation piece of a wedge amplitude-modulating probe card disclosed in embodiment 6.

As shown in FIGS. 8 and 9, the docking structure of the amplitude-modulation piece of the wedge amplitude-modulation probe card comprises a pressing block disk 5-1, a pressing block disk ring 5-2, a pressing block disk ring groove 5-3, a pressing block disk rod 5-4, a pressing block disk stopper 5-5, a slide rest 5-6 and a shell 5-7. Several pressing block disks 5-1 are parallelly and slidably arranged on the pressing block disk rod 5-4 to form a pressing block, and several pressing block disks 5-1 are eccentrically arranged on the pressing block disk rod 5-4. The outer part of each pressing block disk 5-1 is fixed with a pressing block disk ring 5-2, and the upper end of each upper wedge plate 2 is equipped with a pressing block disk ring groove 5-3, and the pressing block disk rod 5-4 on the left side of the pressing block is sleeved with a pressing block disk stopper 5-5, and the pressing block disk rod 5-4 on the right side of the pressing block is sleeved with a disk rod spring 5-6, and the side of the pressing block disk rod 5-4 is provided with a guide bar along the axial direction, the left end of the pressing block disk stopper 5-5 is fixedly connected to the slide rest 5-6, and the slide rest 5-6 is slidably arranged inside the shell 5-7, and the shell 5-7 is fixedly arranged on the probe card main body 1.

The pressure block formed by a plurality of slidably arranged pressing block disks 5-1 can be connected to the upper wedge plate 2 through the pressing block disk 5-1 when the pressing block presses down the upper wedge plate 2, so as to ensure the stability when the upper wedge plate 2 slides. At the same time, the pressing block disk 5-1 can slide down synchronously with the docked upper wedge plate 2 and remain connected during the sliding to the right, so that during the whole sliding process, the upper wedge plate 2 can maintain the sliding stability through the connection of the pressing block disk 5-1.

It should be noted that in the above embodiments, as long as the technical solutions are not contradictory, they can be arranged and combined. Since those skilled in the art can exhaust all the results of permutation and combination according to the knowledge of permutation and combination mathematics learned in high school, these results are not listed one by one in this application, but it should be understood that every permutation and combination result is recorded in this application.

It should also be noted that the above embodiments are only illustrative illustrations of the present patent and do not limit its scope of protection. Those skilled in the art can also make partial changes to them, but as long as they do not exceed the spirit of the present patent, they are within the scope of protection of the present patent.

The invention claimed is:

1. A wedge amplitude-modulation probe card, wherein: it comprises a probe card main body, upper wedge plates and lower wedge plates, several upper wedge plates and several lower wedge plates are slidably arranged inside the probe card main body, and the several upper wedge plates and the several lower wedge plates are sequentially arranged at intervals in a staggered manner;

the probe card main body comprises a main body frame, a probe slot, and an upper wedge plate slot; the main body frame internally accommodates several upper wedge plates and lower wedge plates along the length direction, and the bottom of the main body frame is provided with a probe slot for the probes to pass through along the length direction; The main body frame is also provided with an upper wedge plate slot for the upper wedge plates to be exposed partially;

the upper wedge plate comprises: an upper wedge plate body, an upper wedge plate wedge, upper wedge plate probes, and upper wedge plate contacts; the lower end of the upper wedge plate body is provided with an upper wedge plate wedge, and both sides of the upper wedge plate wedge extend to the two sides of the upper wedge plate body; the lower end of the upper wedge plate body is provided with upper wedge plate probes, and one end of the upper wedge plate contacts is connected to the upper wedge plate probes, and the other end of the upper wedge plate contacts is exposed from one side of the upper wedge plate body;

the lower wedge plate comprises: a lower wedge plate body, a lower wedge plate wedge, lower wedge plate probes, and lower wedge plate contacts; the upper end of the lower wedge plate body is provided with a lower wedge plate wedge, and both sides of the lower wedge plate wedge extend to the two sides of the lower wedge plate body; the lower end of the lower wedge plate wedge is provided with lower wedge plate probes, and one end of the lower wedge plate contacts is connected to the lower wedge plate probes, and the other end of the lower wedge plate contacts is exposed from one side of the lower wedge plate body;

the probe spacing required for the contacts to be tested is defined as the standard probe spacing; the thickness of the upper wedge plate body and the lower wedge plate body are standard probe spacing, the probe card main body is provided with several fixed contacts at intervals at one side corresponding to the upper wedge plate contacts and lower wedge plate contacts, and one end of the several fixed contacts is connected with the testing circuit board, and the other end of the fixed contacts extends to the interior of the main body frame, and the spacing between the adjacent fixed contacts is the standard probe spacing.

2. A wedge amplitude-modulation probe card according to the claim 1, wherein: the probe card main body also comprises: a fixed block for the main body, a movable block for the main body, and a spring for the movable block for the main body; one side of the main body frame is provided with a fixed block for the main body, and the side of the fixed block for the main body contacts one side of the several upper wedge plates and lower wedge plates sequentially arranged at intervals in a staggered manner; and the other side of the main body frame is slidably provided with a movable block for the main body, and the side of the movable block for the main body contacts the other side of the several upper wedge plates and lower wedge plates sequentially arranged at intervals in a staggered manner; and the movable block for the main body is connected to the probe card main body through the spring for the movable block for the main body.

3. A wedge amplitude-modulation probe card according to the claim 2, wherein: the upper wedge plate also comprises an extension plate of the upper wedge plate, and the extension plate of the upper wedge plate is formed by extending the upper end of the upper wedge plate body upwards, and the extension plate of the upper wedge plate passes through the upper wedge plate slot and extends to the outside of the probe card main body.

4. A wedge amplitude-modulation probe card according to the claim 3, wherein: the upper wedge plate also comprises an upper wedge plate slider, and the upper wedge plate body is provided with an upper wedge plate slider on both sides respectively, and the upper wedge plate sliders are slidably connected to the inner wall of the probe card main body.

5. A wedge amplitude-modulation probe card according to the claim 4, wherein: the lower wedge plate also comprises a lower wedge plate slider, and the lower wedge plate body is provided with a lower wedge plate slider on both sides respectively, and the lower wedge plate sliders are slidably connected to the inner wall of the probe card main body.

6. A wedge amplitude-modulation probe card according to claim 1, wherein: an amplitude-modulation structure is arranged above the probe card main body, and the amplitude-modulation structure comprises a pressing block; the pressing block is arranged above the exposed part of the upper wedge plate on the probe card main body, and the pressing block is able to press down on the exposed part of a single or a plurality of upper wedge plates, causing the upper wedge plate to move downward.

7. A wedge amplitude-modulation probe card main body, wherein: several upper wedge plates and several lower wedge plates are slidably arranged inside the probe card main body, and the several upper wedge plates and the several lower wedge plates are sequentially arranged at intervals in a staggered manner; the probe card main body comprises: a main body frame, a probe slot, and an upper wedge plate slot; the main body frame internally accommodates several upper wedge plates and lower wedge plates along the length direction, and the bottom of the main body frame is provided with a probe slot for the probes to pass through along the length direction; the main body frame is also provided with an upper wedge plate slot for the upper wedge plates to be exposed partially; one side of the main body frame is provided with several fixed contacts at intervals at one side, and one end of the several fixed contacts is connected with the testing circuit board, and the other end of the fixed contacts extends to the interior of the main body frame; the probe card main body also comprises: a fixed block for the main body, a movable block for the main body, and a spring for the movable block for the main body; one side of the main body frame is provided with a fixed block for the main body, and the side of the fixed block for the main body contacts one side of the several upper wedge plates and lower wedge plates sequentially arranged at intervals in a staggered manner; and the other side of the main body frame is slidably provided with a movable block for the main body, and the side of the movable block for the main body contacts the other side of the several upper wedge plates and lower wedge plates sequentially arranged at intervals in a staggered manner; and the movable block for the main body is connected to the probe card main body through the spring for the movable block for the main body.

8. A wedge amplitude-modulation probe card according to claim 2, wherein: an amplitude-modulation structure is arranged above the probe card main body, and the amplitude-modulation structure comprises a pressing block; the pressing block is arranged above the exposed part of the upper wedge plate on the probe card main body, and the pressing block is able to press down on the exposed part of a single or a plurality of upper wedge plates, causing the upper wedge plate to move downward.

9. A wedge amplitude-modulation probe card according to claim 3, wherein: an amplitude-modulation structure is arranged above the probe card main body, and the amplitude-modulation structure comprises a pressing block; the pressing block is arranged above the exposed part of the upper wedge plate on the probe card main body, and the pressing block is able to press down on the exposed part of a single or a plurality of upper wedge plates, causing the upper wedge plate to move downward.

10. A wedge amplitude-modulation probe card according to claim 4, wherein: an amplitude-modulation structure is arranged above the probe card main body, and the amplitude-modulation structure comprises a pressing block; the pressing block is arranged above the exposed part of the upper wedge plate on the probe card main body, and the pressing block is able to press down on the exposed part of a single or a plurality of upper wedge plates, causing the upper wedge plate to move downward.

11. A wedge amplitude-modulation probe card according to claim 5, wherein: an amplitude-modulation structure is arranged above the probe card main body, and the amplitude-modulation structure comprises a pressing block; the pressing block is arranged above the exposed part of the upper wedge plate on the probe card main body, and the pressing block is able to press down on the exposed part of a single or a plurality of upper wedge plates, causing the upper wedge plate to move downward.

\* \* \* \* \*